United States Patent [19]
Chi et al.

[11] Patent Number: 5,556,797
[45] Date of Patent: Sep. 17, 1996

[54] METHOD OF FABRICATING A SELF-ALIGNED DOUBLE RECESS GATE PROFILE

[75] Inventors: Tom Y. Chi, San Gabriel; Liping D. Hou, Rancho Palos Verdes; Kusol Lee, Gardena; Danny Li, Torrance; Ishver K. Naik, Rancho Palos Verdes; Tom Quach, Torrance, all of Calif.

[73] Assignee: Hughes Aircraft Company, Los Angeles, Calif.

[21] Appl. No.: 453,676

[22] Filed: May 30, 1995

[51] Int. Cl.$^6$ ................................................ H01L 21/8258
[52] U.S. Cl. .......................... 437/405; 437/203; 437/912
[58] Field of Search ......................... 437/405 H, 415 H, 437/203, 912, 40 RG, 41 RG

[56] References Cited

U.S. PATENT DOCUMENTS

| | | | |
|---|---|---|---|
| 4,616,400 | 10/1986 | Macksey | 437/40 |
| 5,270,228 | 12/1993 | Ishikawa | 437/41 |
| 5,364,816 | 11/1994 | Boos | 437/40 |

FOREIGN PATENT DOCUMENTS

| | | |
|---|---|---|
| 7664 | 1/1989 | Japan. |
| 223771 | 9/1989 | Japan. |

OTHER PUBLICATIONS

DiLorenzo, ed., "GaAs FET Principles and Technology," Artech House, Inc. 1982, pp. 286–289.
Williams, "Gallium Arsenide Processing Techniques," Artech House, Inc., 1984, pp. 69–70.
Hudgens et al. "Process Control of the Spacing Between the Gate and Gate Recess for GaAs MESFETs," 1994 U.S. Conference on GaAs Manufacturing Technology, pp. 45–48.

*Primary Examiner*—Charles L. Bowers, Jr.
*Assistant Examiner*—Michael Trinh
*Attorney, Agent, or Firm*—M. E. Lachman; M. W. Sales; W. K. Denson-Low

[57] ABSTRACT

A method of fabricating a self-aligned double gate recess profile in a semiconductor substrate is disclosed in which a first mask layer is formed over the substrate. A second mask layer having an opening is formed over the first mask layer. An opening at least as wide as the second mask layer's opening is formed through the first mask layer to expose the substrate beneath the second mask layer's opening. A first recess is etched in the semiconductor through the second mask layer's opening. The first mask layer's opening is then uniformly expanded and a wider recess, aligned to the first recess, is then formed in the semiconductor. The method is particularly applicable to the formation of self-aligned gate and channel recesses in a GaAs MESFET.

11 Claims, 5 Drawing Sheets

METHOD OF FABRICATING A SELF-ALIGNED DOUBLE RECESS GATE PROFILE

BACKGROUND OF THE INVENTION

1. Field of the Invention

This invention relates to methods for etching semiconductor substrates, and more particularly to double gate recess etching methods used in the fabrication of GaAs microwave monolithic integrated circuit (MMIC) chips.

2. Description of the Related Art

GaAs circuits are used primarily for radar and communications applications, both in power amplifiers for transmission and in receive circuitry. A higher degree of amplification can be achieved with metal-semiconductor field effect transistors (MESFETs) if the gate is recessed into the GaAs chip, rather than formed on its surface. This type of structure is illustrated in FIG. 1, in which a portion of a GaAs substrate is shown with n+ doped source and drain regions 4 and 6, respective source and drain contacts S and D, and an n-type channel region 8 between the source and drain regions. A single gate recess 9 is formed from the upper substrate surface into the channel region, between and separated from the source and drain region 4, 6. A metallized gate contact G is established to the floor of the recess.

The dimensions of the recess and the gate contact are important factors in determining the characteristics of a power amplifier that employs a gate recess profile MESFET. Specifically, the dimension "a" between the edges of the gate contact G (in the direction of the channel current flow) and the adjacent edges of the recess floor influences the amplifier's operation. In general, a large dimension "a" results in lower efficiency and lower output power, but a higher breakdown voltage level. Depending upon the ultimate application for the transistor, the dimension "a" is selected to yield an optimum tradeoff among these three performance factors.

One disadvantage associated with the single gate recess profile of FIG. 1 is its increased gate-to-drain feedback capacitance as compared to planer FET structures. Gate-to-drain feedback capacitance reduces the FET's gain and makes it less stable by decreasing the isolation between the input and the output. To limit the FET's feedback capacitance and increase its breakdown voltage in a gate recess structure, a second wider recess, the channel recess, is employed so that the depth of the gate recess below the channel recess can be reduced relative to the depth of the gate recess in FIG. 1. The FET's feedback capacitance is thereby reduced while the total gate recess depth is increased to improve the transistor gain. The structure as described, referred to as a double gate recess profile and shown in FIG. 2, has been fabricated in a two step process, in which a shallow, wide channel recess 10 is etched with a first photoresist mask having an opening indicated by m1, followed by replacing the first mask with a second photoresist mask having an opening that is indicated by m2 and through which a narrow gate recess 11 is etched using the same etchant. This technique is described in DiLorenzo, ed., *GaAs FET Principles and Technology*, Artech House, Inc., 1982, pages 286–289 and Williams, *Gallium Arsenide Processing Techniques*, Artech House, Inc., 1984, pages 69–70.

A problem with the double-mask method of forming a double gate recess profile is the difficulty of properly aligning the masks used in forming the gate and channel recesses. Referring to FIG. 2, ideally the gate recess 11 is established in the middle of the channel recess 10. The widths of the channel recess's two planar portions, which lie above and bound the gate recess 11 and are indicated by X1 and X2, would thus be approximately equal. Making X1 and X2 equal is important in providing a balance between the FET's breakdown voltage and its source and gate-to-drain resistances. Since the first and second masks are often not exactly aligned, X1 and X2 usually are not equal. Also, the double-mask process is costly because two mask layers must be established.

Two types of etchants, ammonia hydroxide ($NH_4OH$) and phosphoric acid ($H_3PO_4$), are currently in popular use for etching recesses in GaAs. FIG. 3 illustrates the etch process for $NH_4OH$, in which a partially completed MESFET has been coated with a layer of photoresist 12. An opening 14 is provided in the photoresist over the intended gate recess area, with a photoresist overhang 16 extending over part of the upper portion of the opening 14 to provide a reduced diameter entrance opening 18. The amount of overhang effects the size of the gate recess, and also of the metallized gate contact that is added after the recess has been established. $NH_4OH$ produces an isotropic etch in which the gate recess floor 20 is narrower than the photoresist opening 14. The $H_3PO_4$ process, not shown, performs an anisotropic etch to produce a gate recess floor width that is approximately equal to the photoresist opening width.

SUMMARY OF THE INVENTION

The present invention seeks to provide a new method of etching a semiconductor substrate, and particularly for etching a double gate recess profile for a GaAs MESFET, which results in accurate and repeatable etches, high rates of manufacturing yield, an increase in the breakdown voltage and power of resulting power amplifiers, and the ability to easily change the etch profile for different applications, all without requiring an additional mask layer in the fabrication process.

These and other goals are achieved by establishing a mask layer, preferably in the form of a thin oxide layer, over the semiconductor and etching an initial opening in the mask to expose a portion of the semiconductor. The initial mask opening is formed by depositing a photoresist layer having a predetermined opening over the mask and etching the mask. The initial mask opening is at least as wide as the photoresist opening. A gate recess profile is then etched in the semiconductor through the photoresist opening. Subsequently, the initial mask opening is uniformly expanded about its center to form an expanded mask opening which exposes a larger portion of the semiconductor surface. This is preferably performed by selectively etching the mask opening through the photoresist opening. A substrate etchant is then introduced through the expanded mask opening to etch a channel recess that is self-aligned to the narrower gate recess. This consistently produces a channel recess with two approximately equal planar portions which lie centered above and bound the gate recess.

The mask layer opening can be expanded more than once and progressively wider recesses can be formed after each expansion to produce multiple self-aligned recesses.

These and other features and advantages of the invention will be apparent to those skilled in the art from the following detailed description, taken together with the accompanying drawings.

DETAILED DESCRIPTION OF THE INVENTION

The fabrication of a MESFET in a GaAs wafer, with a self-aligned double gate recess profile precisely controlled and closely matched with a desired profile in accordance with the invention, is illustrated in FIGS. 4a–4i. The invention is applicable to the etching of semiconductor substrates in general, although at present plasma rather than liquid etching is commonly used for semiconductors such as silicon.

Figure 1:
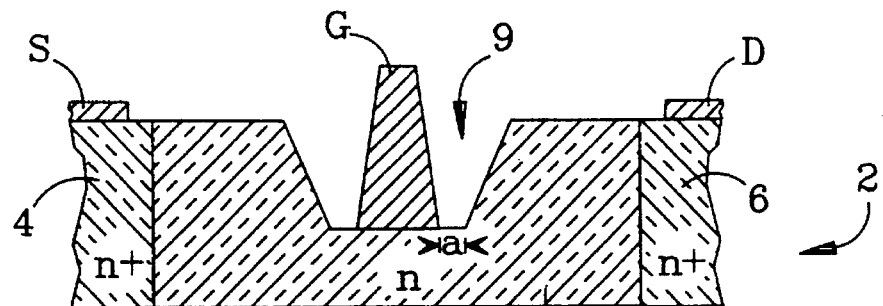
FIG. 1 is a sectional view of a prior art GaAs MESFET, described above.
Figure 2:
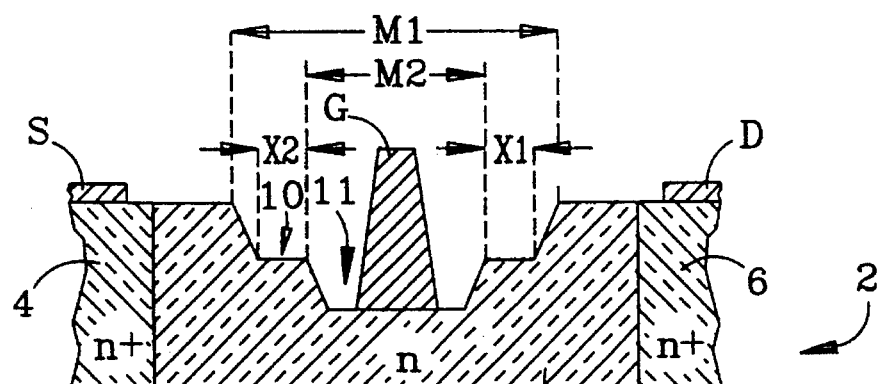
FIG. 2, described above, is a sectional view illustrating the conventional double-mask etching of a double gate recess in GaAs.
Figure 3:
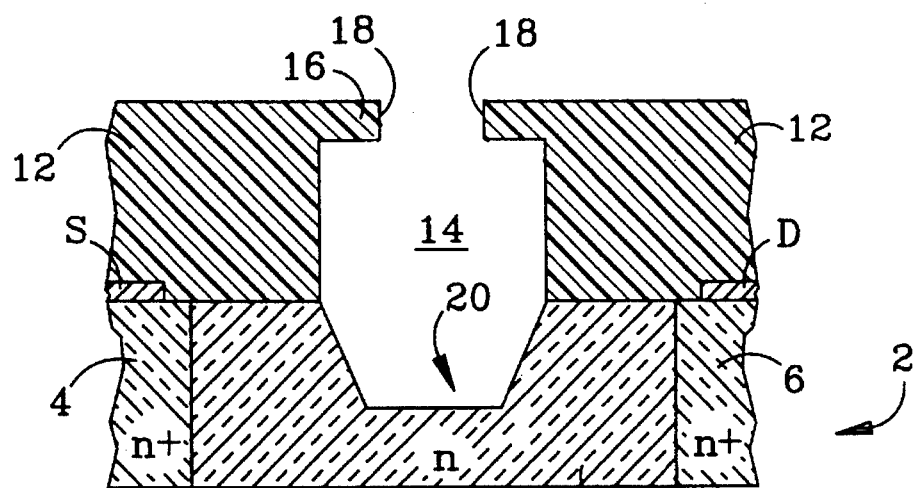
FIG. 3, described above, is a sectional view illustrating an existing method of etching a gate recess in GaAs using ammonia hydroxide.
Figure 4A:
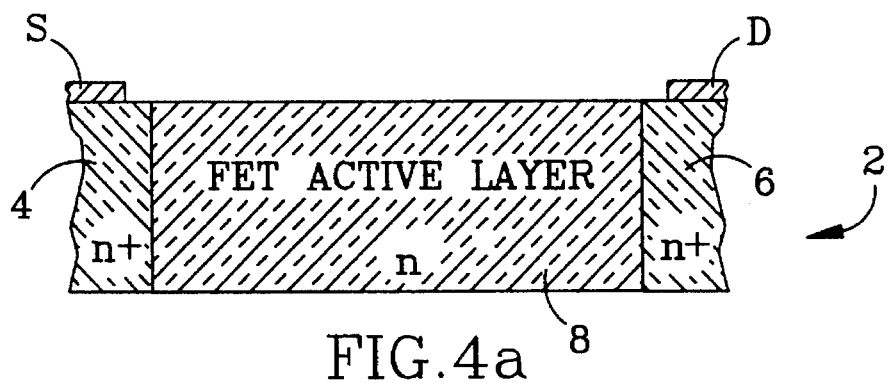
FIGS. 4a–4i are sectional views illustrating successive steps in the fabrication of a GaAs MESFET in accordance with the invention, with the final device illustrated in FIG. 4i.

The same reference numbers are employed in FIGS. 4a–4i as in FIGS. 1–3 to refer to common elements. In FIG. 4a a portion of a die on a GaAs wafer 2 is shown with implanted n+ source and drain regions 4 and 6, an n-type channel region 8 as the FET active layer, and source and drain contacts S and D. Up to this point, the fabrication process is conventional.

Figure 4B:
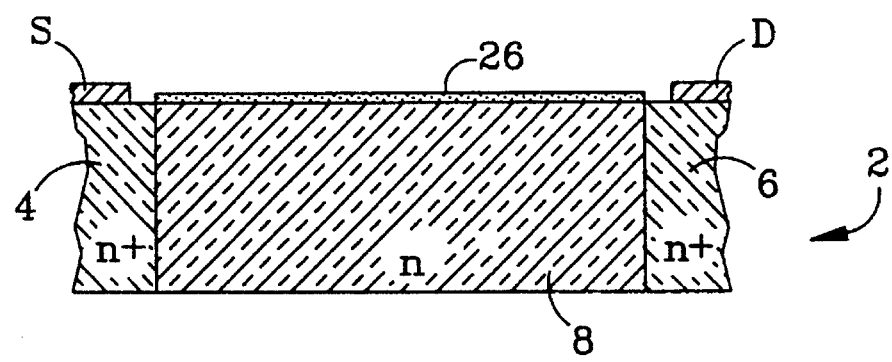
Figure 4C:
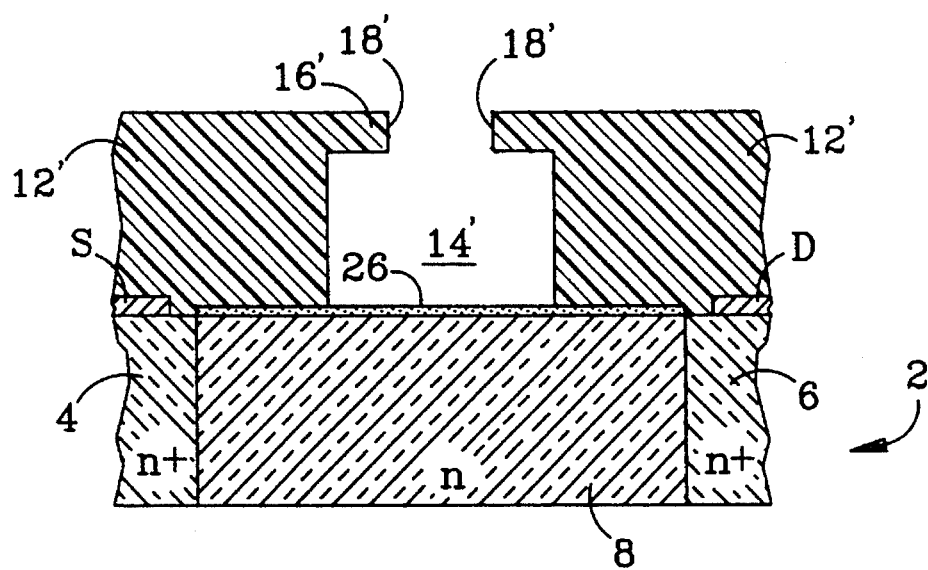

A unique fabrication process is employed to form a self-aligned double gate recess profile in an accurate and repeatable manner. Referring to FIG. 4b, the process starts with growing a thin mask layer 26 over the channel layer 8. The mask 26 is preferably a thin oxide layer approximately 30–70 Angstroms thick. The oxide layer is formed by oxygen plasma on the channel layer 8 or by putting the wafer in an oven to oxidize its surface. The mask layer 26 is made thin to allow the accurate formation of openings through it to expose the channel layer 8 surface. Referring to FIG. 4c, the partially completed MESFET is covered with a layer of photoresist 12' having an opening 14', overhang 16' and reduced entrance 18' similar to the photoresist 12 shown in FIG. 2.

Figure 4D:
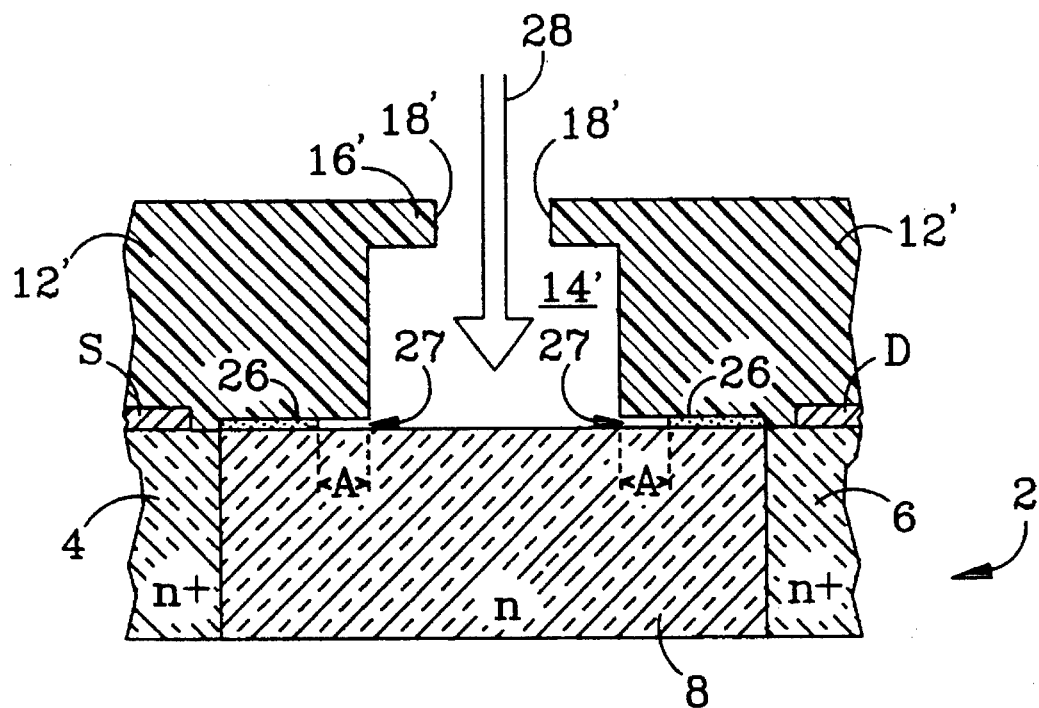

Referring to FIG. 4d, a liquid chemical etchant 28, preferably hydrochloric acid (HCl) or $NN_4OH$ for an oxide mask, is introduced through the entrance opening 18' into the photoresist opening 14' to selectively attack and remove a portion of the mask layer 26. This produces an opening 27 in the mask which exposes the GaAs channel layer 8 under the photoresist opening 14' allowing for a gate recess to be etched in later steps. The mask opening 27 formed is at least as wide as the photoresist opening 14'. The portion of the mask layer 26 removed laterally under the edges of the photoresist opening 14' is indicated by A. A is approximately 0.1–0.2 microns and depends upon the amount of time the mask layer 26 is exposed to the etchant 28.

Although a portion of the mask layer 26 is removed under the edges of the photoresist opening 14', the width of the gate recess formed in later steps is controlled by the edges of the photoresist opening 14' and not the mask layer opening 27. This is desirable because the width of the photoresist opening 14' can be accurately established, allowing for accurate gate recess formation. To ensure that the photoresist opening 14' forms the boundaries of the gate recess, the mask layer is made thin, as described above, to prevent GaAs etchants from flowing under edges of the photoresist layer opening 14'. If the mask layer 26 is made too thick, for example 100 angstroms thick, GaAs etchants will penetrate under the photoresist opening 14' and the mask layer opening 27 will control the width of the gate recess. This would produce a wider gate recess than desired which in turn would produce a larger than desired "a" value as described in reference to FIG. 1.

Figure 4E:
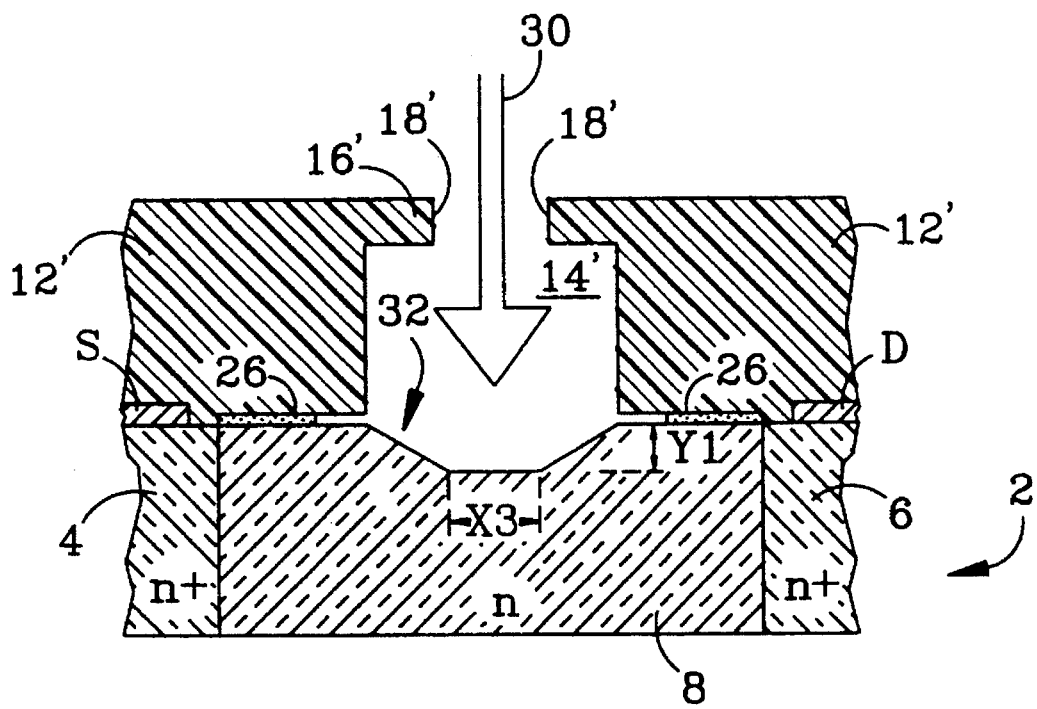

Referring to FIG. 4e, after the mask layer opening 27 has been formed, one or a combination of different GaAs etchants are used to etch a gate recess 32 into the channel layer 8. If more than one etchant is employed, the lateral and vertical etch rates of each etchant are different, and by controlling the etch time with each etchant a desired recess profile can be achieved. The most commonly used etchants for GaAs are phosphoric acid and ammonia hydroxide. Alternate etchants that can be used with the invention for GaAs include hydrochloric acid (HCl), sulfuric acid ($H_2SO_4$) and citric acid ($C_6H_8O_7$).

Referring to FIG. 4e, the formation of a gate recess is accomplished by introducing a liquid etchant 30 through the entrance opening 18' and into the photoresist opening 14' to attack the exposed surface of the channel layer 8. Since the photoresist opening 14' can be established at a predetermined width, a gate recess 32 with a desired depth and optimal profile is achieved. Etching with the etchant 30 is continued for a predetermined period of time, as determined by the ultimate desired recess profile. Two significant dimensions of the gate recess profile are its width, indicated by X3, and its depth, indicated by Y1.

The etching process can be accomplished simply by placing the wafer in a beaker of the liquid etchant, or alternately by spraying on the etchant. After the predetermined etch period has elapsed, the application of etchant is discontinued and the wafer is rinsed with water to remove any residual etchant.

The width of the recess that is formed in the substrate will generally vary positively with the size of the entrance opening 18'. The time period during which an etchant is applied will therefore depend to a certain extent upon the size of this opening. The etchant time can be determined on a trial-and-error basis for a given entrance opening size. During volume manufacturing, the etch time will normally be kept constant from wafer to wafer. The entrance opening size is measured for each wafer, typically with a scanning electron microscope (SEM); the wafer can be reworked if the opening size does not meet the specifications. Since the entrance opening size will generally be repeated for all dies on a given wafer, only one die per wafer need be measured.

Figure 4F:
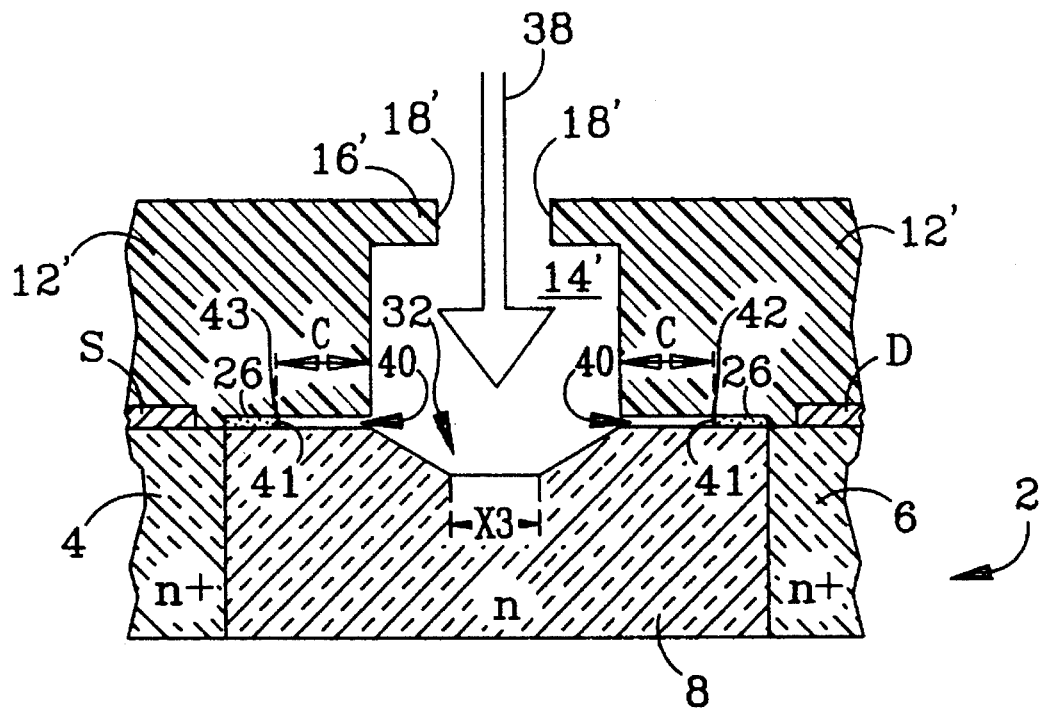

Referring now to FIG. 4f, once the gate recess profile 32 is established, etching of the mask layer 26 is resumed by introducing a liquid chemical etchant 38, preferably hydrochloric acid (HCl) or $NN_4OH$ for an oxide mask, through the entrance opening 18' into the photoresist opening 14' to selectively attack and remove a portion of the mask layer 26 below the photoresist 12'; the etchant does not significantly attack the photoresist 12' or the substrate. The amount of the mask layer 26 removed laterally on each side of the gate recess 32 is approximately equal, as indicated by C, and depends on the amount of time the mask is exposed to the etchant 38. C is preferably approximately 0.3–0.4 microns. The partial removal of the mask layer 26 creates equal cavities 40 under the photoresist 12' on opposite sides of the gate recess 32. The expanded mask opening 41 is thus created by uniformly widening the initial opening 27 in the mask layer 26 from the edges of the photoresist opening 14' to locations 42 and 43 on opposite sides of the gate recess 32 and beneath the photoresist 12'. Furthermore, since the new mask layer opening 41 is formed by expanding the initial mask opening 27 equally on all sides, the new opening is self aligned to the photoresist opening 14'. This improves upon the existing double-mask process which introduces errors in attempting to align two mask openings.

Figure 4G:
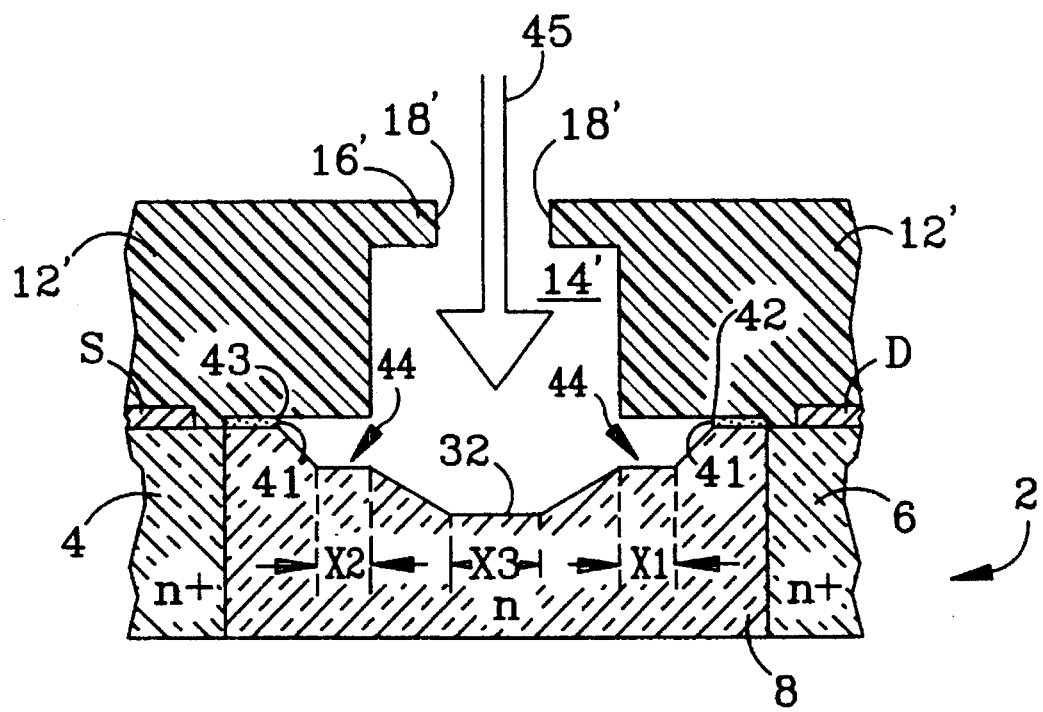

Referring to FIG. 4g, a channel recess 44 is established by etching the exposed substrate through the expanded mask layer opening 41 in a manner similar to that used to establish the gate recess 32. This includes introducing one or more GaAs etchants, indicated by reference number 45, into the photoresist opening 14' and controlling the etch time to tailor the double recess profile to the needs of a particular application. In etching the channel recess 44, the etchant 45 flows under the photoresist layer 12' to locations 42 and 43 because the gate recess 32 provides a cavity for the accumulation of the etchant 45. Thus, there is more etchant to attack the substrate under the photoresist layer 12' up to locations 42 and 43. This is different from the etching of the gate recess 32 described in reference to FIG. 4e, because the surface of the substrate was flat prior to forming the gate recess 32, providing insignificant contact between the etchant 30 and the substrate under the edges of the photoresist opening 14'. Therefore, the gate recess 32 was formed only up to the edges of the photoresist opening 14'.

FIG. 4g shows an example of a double recess profile formed after a predominantly anisotropic etch of the substrate which preserves the floor width of the gate recess 32 at approximately X3. In etching the substrate, the boundaries of the channel recess 44 are defined by the expanded opening 41 in the mask layer 26. Since the same photoresist opening 14' is used for the successive etches of the mask layer, the opposite edges 42 and 43 of the expanded mask layer opening 41 are equidistant from the edges of the photoresist opening 14' and allow the channel recess to be centered upon the narrower gate recess. This self-alignment of the channel and gate recesses consistently establishes X1 approximately equal to X2, which is not possible with the prior double-mask method.

At this point, another portion of the mask layer 26 could be etched to create a new opening for additional etching of the GaAs substrate. Each additional etch would form a wider recess centered around the channel layer recess, and also deeper than the prior recess. By continuing this process, a multiple recesses profile can be achieved.

Figure 4H:
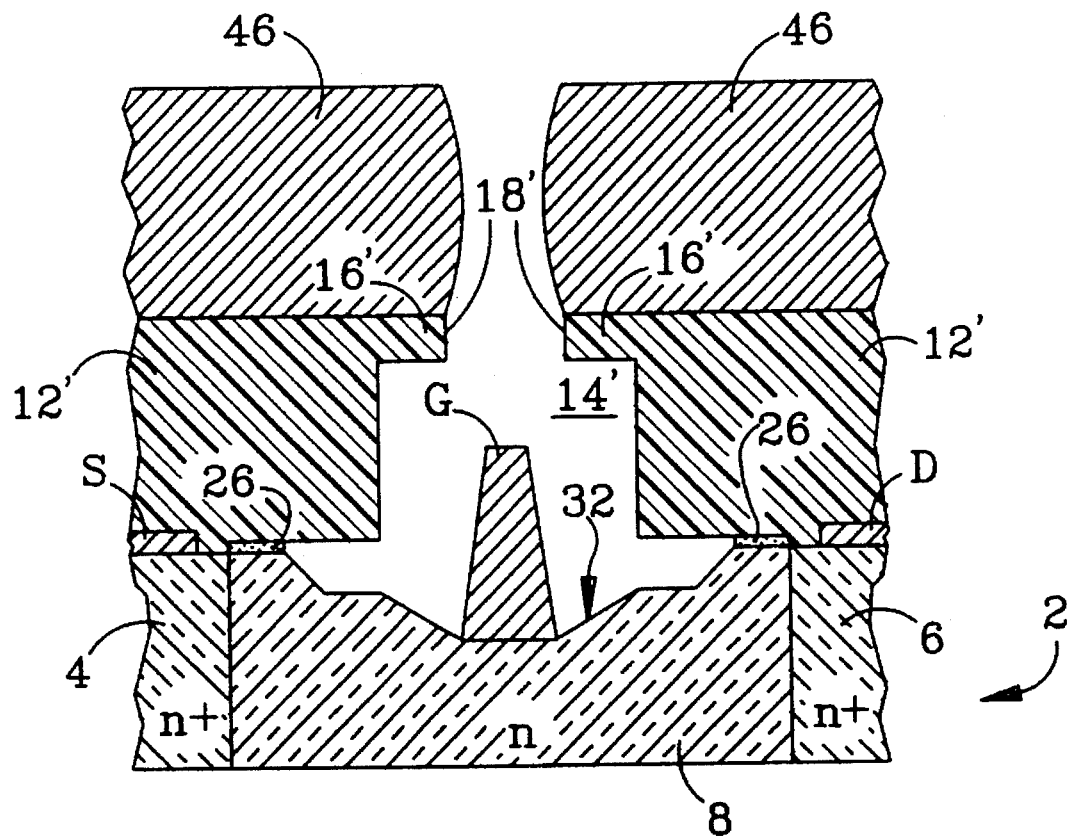
Figure 4I:
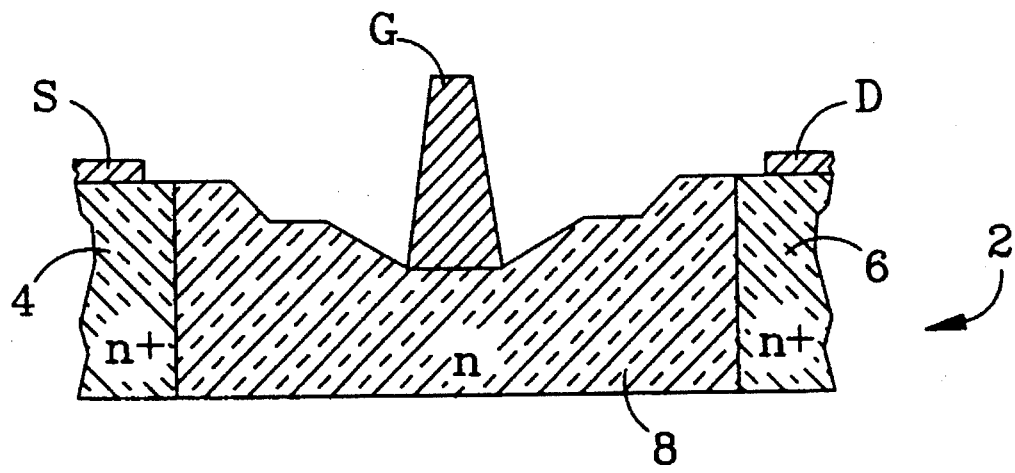

Referring to FIG. 4h, once the desired double recess profile has been established, a metallization 46 is laid over the wafer and extends in through the entrance opening 18' to form a gate contact G on the floor of the gate recess 32. The photoresist 12' is then lifted off in a conventional manner, carrying with it the overlying metallization layer 46. Finally, the remaining mask layer 26 is lifted off to leave a finished MESFET as shown in FIG. 4i.

The invention provides a simple and consistent process for forming a self-aligned double gate recess profile, which is particularly useful in obtaining optimal performance with GaAs MMIC chips. It allows the chips to be fabricated in high volume with consistently good results, and with a significantly improved manufacturing yield that results in large cost savings. While particular embodiments of the invention have been shown and described, numerous alternate embodiments will occur to those skilled in the art. Accordingly, it is intended that the invention be limited only in terms of the appended claims.

We claim:

1. A method of forming a desired recess profile in a semiconductor substrate, comprising:

forming a first mask layer in direct contact with said substrate, wherein said first mask layer has a thickness of 30–70 angstroms, forming a second mask layer with an opening over said first mask layer;

forming an initial opening through said first mask layer to expose the substrate beneath said first opening in said second mask layer, with said initial opening being at least as wide as said first opening in said second mask layer, forming an initial recess in said substrate through said first opening in said second mask layer, wherein said initial recess has a first width, uniformly expanding said initial opening in said first mask layer to form a subsequent opening in Said first .mask layer, and forming a second recess in said substrate wherein said second recess has a second width which is wider than said first width and is centered on said initial recess.

2. The method of claim 1, wherein said first mask layer comprises an oxide layer.

3. The method of claim 1, wherein said second mask layer comprises a layer of photoresist and said first opening is disposed over a desired initial recess area.

4. The method of claim 3, wherein said expanding of said initial opening in said first mask layer is provided by removing a portion of said first mask layer from beneath said photoresist layer.

5. The method of claim 1, wherein said substrate comprises GaAs.

6. A method of forming a GaAs microwave monolithic integrated circuit (MMIC) metal semiconductor field effect transistor (MESFET) which includes an active layer and a source and drain in a GaAs substrate, comprising:

forming a first mask layer in direct contact with said active layer, wherein said first mask layer has a thickness of 30–70 angstroms, forming a second mask layer with an opening over said first mask layer;

forming an initial opening through said first mask layer to expose the active layer beneath said first opening in said second mask layer, with said initial opening being at least as wide as said first opening in said second mask layer, forming a gate recess in said active layer through said first opening in said second mask layer, wherein said gate recess has a first width, expanding said initial opening in said first mask layer to form a subsequent opening in said first mask layer, and forming a channel recess in said active layer through said subsequent opening in said first mask layer wherein said channel recess has a second width which is wider than said first width and centered upon said gate recess.

7. The method of claim 6, wherein said first mask layer comprises an oxide layer.

8. The method of claim 6, wherein said second mask layer comprises a layer of photoresist with an opening over a desired gate recess area.

9. The method of claim 8, wherein said expanding of said initial opening in said first mask layer is provided by removing a portion of said first mask layer from beneath said photoresist layer to uniformly expand said initial opening in said first mask layer.

10. A method for forming a GaAs microwave monolithic integrated circuit (MMIC) metal semiconductor field effect transistor (MESFET) which includes an active layer and a source and drain in a GaAs substrate, comprising:

forming an oxide layer over said active layer wherein said oxide layer has a thickness of 30–70 angstroms, forming a photoresist layer over said oxide layer, with an opening in said photoresist layer exposing a portion of said oxide layer over a desired recess area between said source and drain, forming an opening through said oxide layer at least as wide as said photoresist opening by removing at least said exposed portion of said oxide layer, forming a gate recess in said active layer through said photoresist opening, uniformly expanding said oxide layer opening by removing a portion of said oxide layer beneath said photoresist layer, and etching said substrate through said expanded oxide layer opening to deepen said gate recess, and to form a channel recess that is wider than and centered upon said gate recess.

11. The method of claim 10, wherein said oxide layer is removed by etching it with HCl or $NN_4OH$.

\* \* \* \* \*